United States Patent [19]

Hibino

[11] Patent Number: 6,033,923
[45] Date of Patent: Mar. 7, 2000

[54] METHODS OF EVALUATING TITANIUM NITRIDE AND OF FORMING TUNGSTEN WIRING

[75] Inventor: Satoshi Hibino, Hamamatsu, Japan

[73] Assignee: Yamaha Corporation, Japan

[21] Appl. No.: 08/946,777

[22] Filed: Oct. 8, 1997

[30] Foreign Application Priority Data

Oct. 14, 1996 [JP] Japan ..................................... 8-291163

[51] Int. Cl.$^7$ ........................... H01L 21/66; G01R 31/26; G01B 11/06
[52] U.S. Cl. ............................................... 438/16; 356/382
[58] Field of Search ........................... 438/7, 16; 356/382

[56] References Cited

U.S. PATENT DOCUMENTS 5,835,226  11/1998  Berman et al. .......................... 356/382

FOREIGN PATENT DOCUMENTS 61-70443  4/1986  Japan .

*Primary Examiner*—Brian Dutton
*Attorney, Agent, or Firm*—Ostrolenk, Faber, Gerb & Soffen, LLP

[57] ABSTRACT

After a TiN film is formed on an Si substrate by sputtering, CVD or the like, an optical constant such as a refractive index of the TiN film is measured. If the refractive index relative to light having a wavelength of 700 nm is 2.0 or smaller, it is judged that a nitridation degree of the TiN film is sufficiently high (near to a composition ratio Ti/N=1). A W film formed on the TiN film judged as above has good adhesion relative to the TiN film. This W film forming method may be applied to forming a wiring with a W plug.

31 Claims, 4 Drawing Sheets

METHODS OF EVALUATING TITANIUM NITRIDE AND OF FORMING TUNGSTEN WIRING

This application is based on Japanese Patent Application No. 8-291163 filed on Oct. 14, 1996, the entire contents of which are incorporated herein by reference.

BACKGROUND OF THE INVENTION a) Field of the Invention

The present invention relates to a method of forming a wiring layer including a titanium nitride (TiN) film, and more particularly to methods of evaluating a TiN film and of forming a tungsten (W) wiring layer, applicable to a method of forming a wiring layer having a TiN film as an underlying layer of a W layer.

b) Description of the Related Art

A wiring forming method is known which forms a TiN film as an underlying layer of a W plug or a W wiring. A TiN film of this kind is formed by reactive sputtering or CVD (chemical vapor deposition) in order to improve adhesion of a W plug or a W wiring.

Generally, intrinsic TiN has a stoichiometric composition ratio Ti:N of 1:1 with high crystallinity, providing a low resistivity of about 50 $\mu\Omega$-cm like Ti. Metal Ti has a low resistivity. As Ti is nitrided and its nitridation progresses, the resistivity increases, and as the nitridation further progresses, the resistivity reduces to such values like that of Ti. Conventionally, if a measured sheet resistance of a TiN film has a predetermined value or lower, the TiN film has been evaluated to be good.

With this evaluation method, however, a Ti rich TiN film having a low nitridation degree can be judged to be good because its sheet resistance is low. The evaluation results therefore are low in reliability and precision.

If a W plug or W wiring layer is formed on a TiN film having a low nitridation degree, sufficient adhesion between the TiN film and the W plug or W wiring layer cannot be obtained.

SUMMARY OF THE INVENTION

It is an object of the present invention to provide a novel TiN film evaluation method capable of non-destructively performing precise judgement of a nitridation degree.

It is another object of the present invention to provide a novel W wiring forming method capable of providing sufficient adhesion.

According to one aspect of the present invention, there is provided a method of evaluating a titanium nitride film comprising the steps of: forming a titanium nitride film over a substrate; measuring an optical constant of the titanium nitride film; and judging a nitridation degree of the titanium nitride film in accordance with the measured optical constant.

According to another aspect of the present invention, there is provided a method of forming a tungsten film comprising the steps of: forming a titanium nitride film over a substrate; measuring an optical constant of the titanium nitride film; judging a nitridation degree of the titanium nitride film in accordance with the measured optical constant; determining the conditions of forming the titanium nitride film in accordance with the results of the judgement step, the conditions satisfying that a nitridation degree of the titanium nitride film has a predetermined criterion; forming another titanium nitride film covering another substrate, in accordance with the conditions determined by the conditions determining step; and forming a tungsten film on the another titanium nitride film.

According to still another aspect of the present invention, there is provided a method of forming a tungsten film comprising the steps of: forming a titanium nitride film over a substrate; measuring an optical constant of the titanium nitride film; judging from the measurement result of the optical constant whether a nitridation degree of the titanium nitride film satisfies a predetermined criterion; and forming a tungsten film on the titanium nitride film if the judgement by the judging step is affirmative.

A W layer formed on a TiN film having a sufficiently high nitridation degree has high adhesion. By forming the W layer after the nitridation degree of the TiN film is checked, a W wiring pattern can be formed with high reliability. If the result of the judgement step is negative, a nitridation process may be performed to make the nitridation degree of the TiN film satisfy a predetermined criterion. For example, the TiN film may be annealed in a nitrogen atmosphere. Thereafter, a W film is formed on the TiN film.

It is therefore possible to non-destructively judge a nitridation degree or composition of a TiN film.

Since a W film is formed on a TiN film which satisfies a predetermined criterion, a sufficient adhesion strength of the W film can be realized to thereby considerably reduce adhesion defects.

DETAILED DESCRIPTION OF THE PREFERRED EMBODIMENTS

Studies made by the inventor show that a refractive index n (real part of a complex refractive index $N=n+ik$) of a TiN film relative to near infrared light of a wavelength of about 700 nm, for example, lowers as Ti nitridation progresses and that of intrinsic TiN (composition ratio Ti/N=1) becomes about 1, although a refractive index n of Ti is about 4. The refractive index is measured by spectroscopic ellipsometry.

The studies also show that a refractive index n of a TiN film is a single-valued function of nitridation degree whereas a resistivity of a TiN film is a dual-valued function of nitridation degree. It is therefore possible to estimate a nitridation degree with higher reliability from a refractive index n than from a resistivity.

Figure 8:
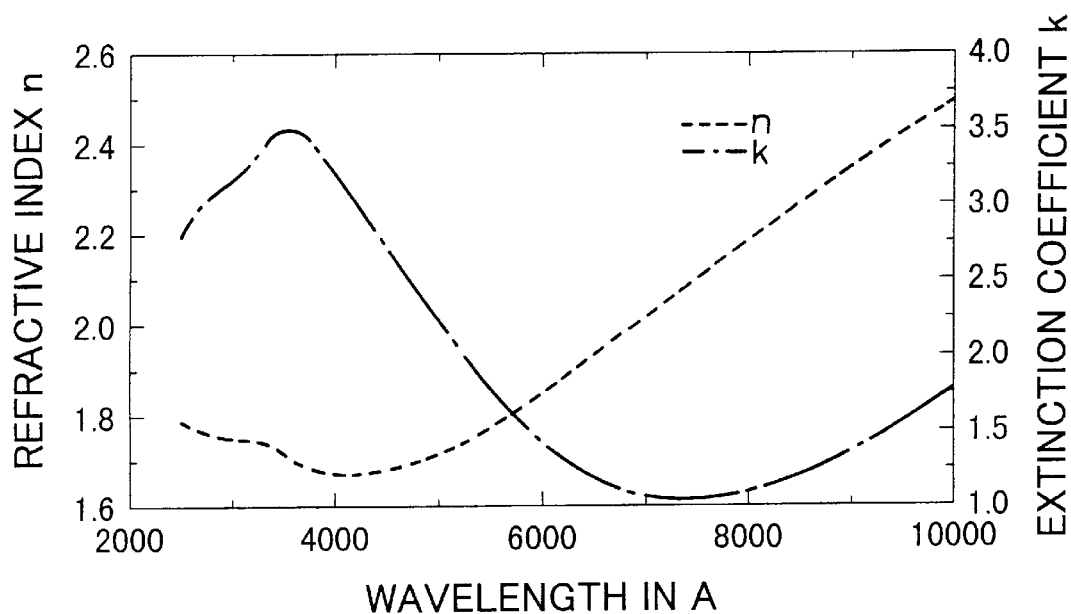
FIG. 8 is a graph of optical constants n and k of a TiN film as a function of wavelength.

FIG. 8 shows an example of variation of optical constants of a sputtered TiN film as a function of wavelength. The abscissa represents wavelength in A, and the ordinate represents refractive index n and extinction coefficient k of the complex refractive index N=n+ik. It can be seen that the wavelength region from about 6500 A to 8500 A is the least absorption region and the refractive index n takes a minimum value at about 4000 A and monotonically increases as the wavelength increases.

Figure 1:
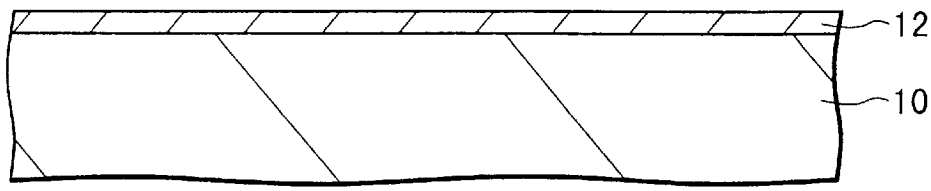
FIG. 1 is a cross sectional view of a substrate illustrating a TiN film forming process in a W film forming method according to an embodiment of the invention.
Figure 2:
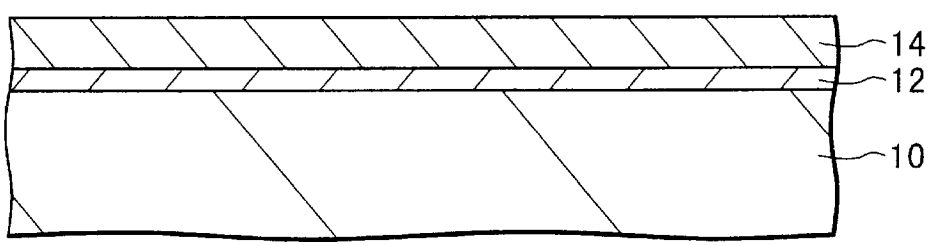
FIG. 2 is a cross sectional view of the substrate illustrating a Wi film forming process following the process illustrated in FIG. 1.

FIGS. 1 and 2 illustrate a W film forming method according to an embodiment of the invention.

In the process shown in FIG. 1, a TiN film 12 of 50 nm thick is formed on the surface of a Si (silicon) substrate 10. Various methods can be used for the formation of the TiN film 12, as will be described later with reference to Table 1.

In the process shown in FIG. 2, a W film 14 of 500 nm thick is formed on the TiN film 12 by blanket CVD.

Figure 3:
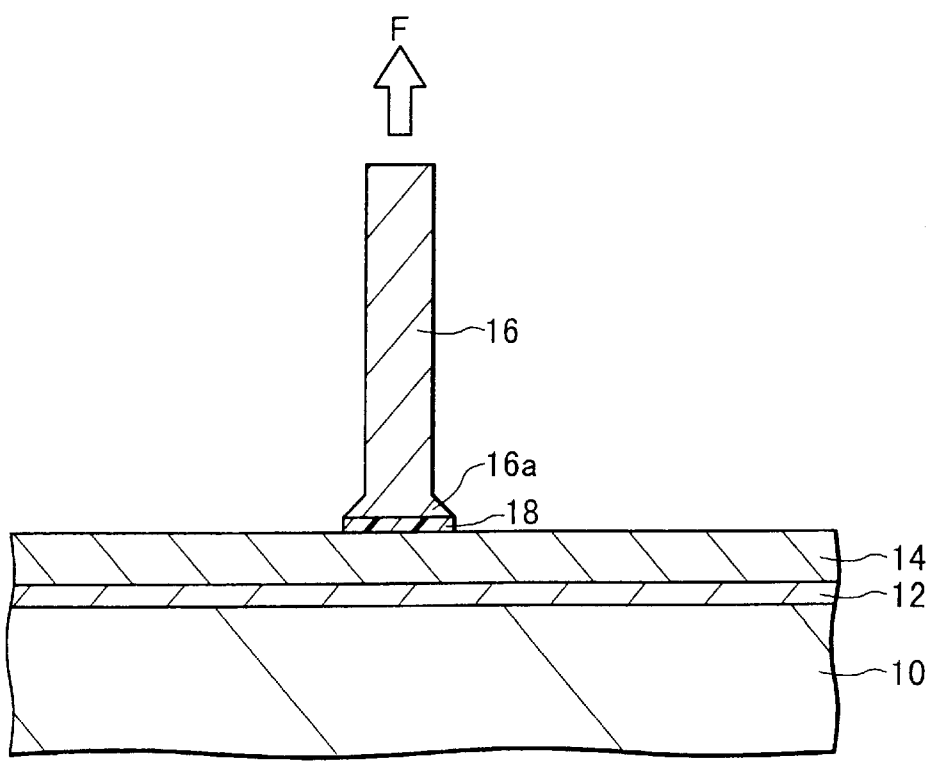
FIG. 3 is a cross sectional view of a substrate illustrating a method of measuring an adhesion strength of a W film.

FIG. 3 illustrates how an adhesion strength of the W film is measured. Like parts to those shown in FIGS. 1 and 2 are represented by using identical reference numerals. A rod-like measuring piece 16 is made of aluminum and has a diameter of its base 16a larger than its main body.

For the measurement of adhesion strength, the base 16a of the measuring piece 16 is bonded in an upright state to the W film 14 with epoxy resin adhesive 18. A drying process is performed at 150° C. for 30 minutes with a hot plate.

Next, the measuring piece 16 is pulled up in the vertical direction with a force F which is gently increased. If interfaces between the W film 14 and measuring piece 16 and between the Si substrate 10 and TiN film 12 have a sufficiently large adhesion strength, peeling occurs at the interface between the W film 14 and TiN film 12. This force F applied when peeling occurs is an adhesion strength between the W film 14 and TiN film 12. On the other hands, if the adhesion strength between the W film 14 and TiN film 12 is sufficiently large, peeling occurs at an interface between the measuring piece 16 and W film 14 or at an interface between the TiN film 12 and Si substrate 10. In this case, the adhesion strength between the W film 14 and TiN film 12 is larger than the pulling force F.

Samples 1 to 10 shown in Table 1 were prepared. TiN films 12 were formed by different methods in the process of FIG. 1, and the refractive indices of these samples relative to light having a wavelength of 700 nm were measured with an ellipsometer. After the measurements of the refractive indices, W films were formed by the process illustrated in FIG. 2, and the adhesion strength $kgf/cm^2$ between the TiN film 12 and W film 14 of each sample was measured by the method illustrated in FIG. 3. These results are shown in Table 1. The adhesion strength is given by F/S where S is an adhesion area in $cm^2$ of the base 16a of the measuring piece 16.

TABLE 1

| Sample | Film forming method | Refractive index | Adhesion strength |
|---|---|---|---|
| 1 | SP | 2.4 | 150 |
| 2 | SP | 3.2 | 50 |
| 3 | CVD | 2.1 | 300 |
| 4 | CVD | 2.5 | >350 |
| 5 | N$_2$ANL | 2.8 | 200 |
| 6 | SP | 1.8 | >350 |
| 7 | SP | 1.4 | >350 |
| 8 | CVD | 1.5 | >350 |
| 9 | CVD | 1.1 | >350 |
| 10 | N$_2$ANL | 1.5 | >350 |

"Film forming method" is the process of forming a TiN film 12 illustrated in FIG. 1, "SP" stands for reactive sputtering, "CVD" stands for chemical vapor deposition, and "N$_2$ANL" stands for thermal nitridation of annealing a Ti film formed by sputtering in an N$_2$ (nitrogen) atmosphere.

As seen from the measurement results shown in Table 1, an adhesion strength greater than 350 $kgf/cm^2$ can be obtained with good reproductivity for those TiN films (sample Nos. 6 to 10 having a refractive index of 2.0 or smaller. However, for those TiN films (sample Nos. 1 to 5) having a refractive index larger than 2.0, the adhesion strength is generally small and has a large variation.

Evaluation of the quality of a TiN film can be performed by using the measurement results shown in Table 1. Namely, since the nitridation degree of a TiN film becomes higher as the refractive index becomes nearer to 1, it can be judged that a TiN film having a refractive index of 2.0 or smaller has a nitridation degree or a composition near the intrinsic TiN.

A W film having a large adhesion strength can be formed on a TiN film judged as above, as has been evaluated from the measurement results shown in Table 1. In order to form a W film having a large adhesion strength, therefore, the conditions of forming a titanium nitride film having a refractive index of 2.0 or lower are first determined, and in accordance with the determined conditions, a TiN film 12 is formed by the process of FIG. 1. For example, if reactive sputtering is used, a TiN film 12 having a refractive index of 2.0 or lower can be formed under the conditions of a gas flow ratio N$_2$/Ar>1.2 and a substrate temperature of 300° C. Thereafter, a W film 14 is formed on the TiN film 12 by the process of FIG. 2.

With this tungsten film forming method, if a nitridation degree of a titanium nitride film satisfies a predetermined criterion, for example, a refractive index of 2.0 or lower relative to light having a wavelength of 700 nm, a tungsten film formed on this titanium nitride film can provide a sufficient adhesion strength of 350 $kgf/cm^2$ or larger. The inventor assumes that such an improved adhesion strength results from a stabilized surface of the titanium nitride film having a composition near intrinsic TiN without oxidation or contamination. A Ti film or an imperfect (low nitridation) TiN film has an active or unstable surface so that this film can be easily oxidized or contaminated. It is known from experimental facts that a tungsten film is difficult to be formed on an oxidized or contaminated surface. It can be therefore supposed that a W layer formed on a low nitridation TiN film has low adhesion.

Preferably, monitor wafers are also prepared for the measurement of refractive index, by forming a thermal oxide film of 500 nm thick on silicon wafers in a diffusion furnace. TiN films are formed on the product wafers and the monitor wafers in the same batch. For example, TiN films are formed by CVD to a thickness of 100 nm under the following conditions: microwave (2.45 GHz) power 2.8 kW, ambient pressure 1.0 mTorr (flow rates: Ar 75 cc/min, $N_2$ 8 cc/min, $H_2$ 26 cc/min, $TiCl_4$ 20 cc/min), substrate temperature 650° C., and deposition rate 45 nm/min.

TiN films can also be formed by sputtering a Ti film followed by nitridation or by sputtering a TiN film. Sputtering may tend to lower the degree of nitridation.

For example, a Ti film of 30 nm thick is formed under the conditions of power 1.0 kW, pressure 3.0 Torr (flow rate Ar 100 cc/min), substrate temperature 150° C. and deposition rate 120 nm/min. Then, the TiN film is nitrided by lamp annealing under the conditions of, normal (1 atm) pressure, heating speed 50° C./sec, anneal temperature 650° C., anneal period 30 sec, atmosphere $N_2$ (flow rate 30 liter/min).

In another example, a TiN film of 50 nm thick is sputtered under the conditions of power 5.0 kW, pressure 4.0 mTorr (flow rates Ar 20 cc/min, and $N_2$ 45 cc/min), substrate temperature 200° C., and deposition rate 100 nm/min. The sputtered TIN film is nitrided in a thermal diffusion furnace under the conditions of normal pressure, substrate temperature 400° C., duration 30 min, atmosphere $N_2$ (flow rate 20 liter/min.).

Another method may be used as a method of forming a W film having a large adhesion strength. Namely, a refractive index of a TiN film 12 is measured after the process of FIG. 1 to judge whether the measured value is 2.0 or lower. If this judgement is affirmative, the process of FIG. 2 is executed to form a W film 14. In this manner, good adhesion is ensured unless other factors are accidentally entered. A TiN film judged as having a refractive index larger than 2.0 may be discarded without executing the W film forming process of FIG. 2. However, in this case, it is preferable to use it by performing the nitridation process as mentioned above to reduce the refractive index to 2.0 or lower. For example, an annealing process is performed at 400° C. in an $N_2$ atmosphere. It is also preferable to measure again the refractive index after the annealing process. A W film 14 is thereafter formed by the process of FIG. 2.

FIGS. 4 to 7 illustrate another embodiment of the invention applied to a wiring layer forming method.

Figure 4:
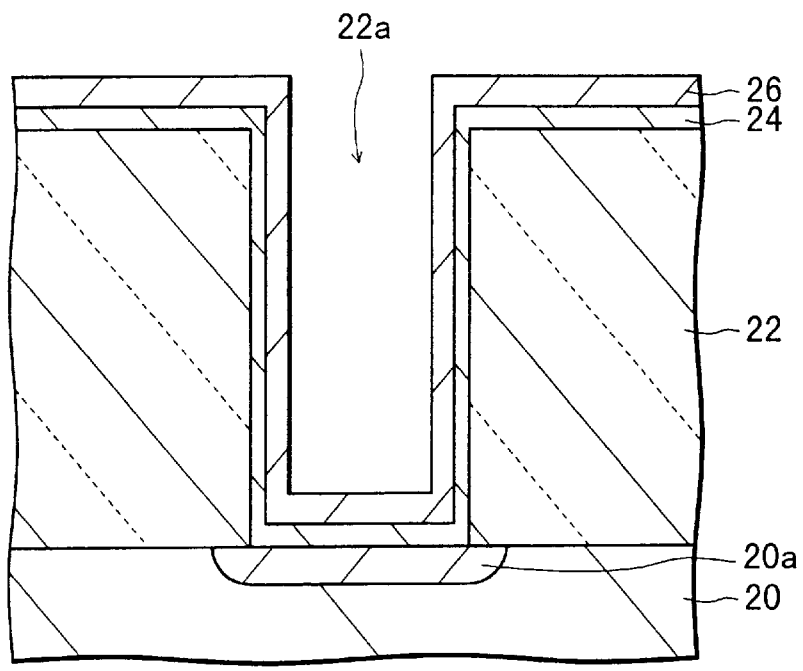
FIG. 4 is a cross sectional view of a substrate illustrating a TiN film forming process in a W film forming method according to another embodiment of the invention.

In a process illustrated in FIG. 4, a contact hole 22a is formed by known photolithography and selective dry etching through an insulating film 22 of silicon oxide or the like which covers the surface of a semiconductor substrate 20 of silicon or the like, the contact hole 22a reaching an impurity doped region 20a formed in a substrate surface layer. A Ti film 24 serving as a film that lowers a contact resistance is formed by sputtering or the like, to cover the contact hole 22a and insulating film 22. In this example, although the Si substrate has the impurity doped region formed in its surface layer, another Si substrate may be used which has a polysilicon wiring layer formed over the substrate surface and an insulating film such as an oxide film formed on the polysilicon wiring layer. A connection hole may be formed to expose the polysilicon wiring.

Next, a TiN film 26 as an adhesion film is formed covering the contact hole 22a and insulating film 22. For example, the TiN film 36 is formed to a thickness of 100 nm by reactive sputtering. The process conditions may be a gas flow ratio $N_2/Ar=1.5$, a pressure of 4 mTorr, a temperature of 200° C. and a power of 6 kW. As the process of forming the TiN film 26, CVD, thermal nitridation or the like shown in Table 1 may be used. Irrespective of which method is used, the process conditions are first determined which satisfy that a refractive index of the TiN film 26 relative to light having a wavelength of 700 nm is 2.0 or lower, and thereafter the TiN film 26 is formed under the determined process conditions.

Figure 5:
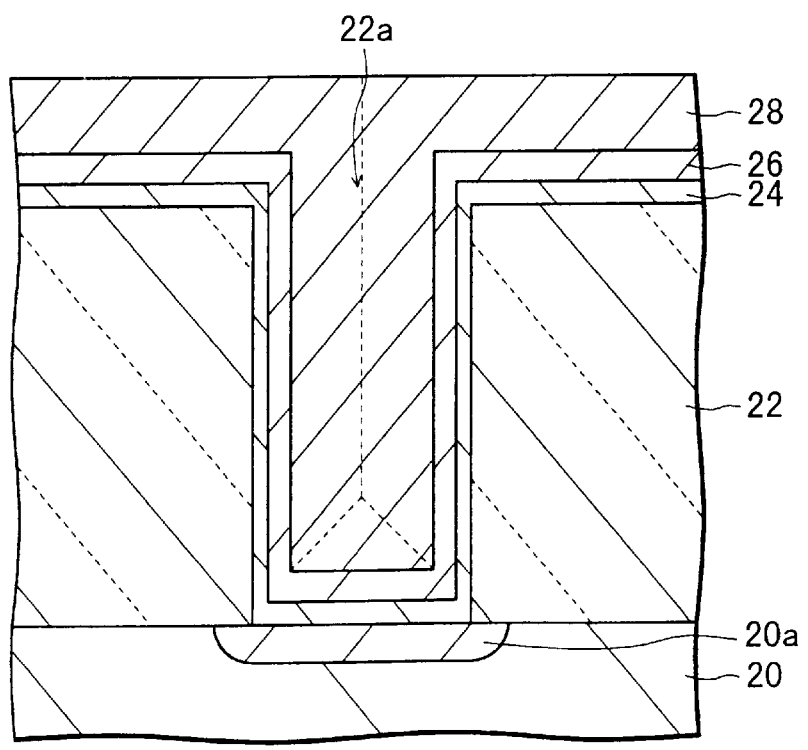
FIG. 5 is a cross sectional view of the substrate illustrating a W film forming process following the process illustrated in FIG. 4.

The process conditions may not be preliminarily determined. A refractive index of the TiN film 26 is measured after it is formed by the process of FIG. 1, and if the measured value is 2.0 or lower, the process illustrated in FIG. 5 is performed. If the measured value is larger than 2.0, a nitridation process is executed to reduce the refractive index to 2.0 or lower. In this case, the refractive index of the TiN layer is preferably measured again, and after it is confirmed that the measured value is 2.0 or smaller, the process of FIG. 5 is executed.

In the process of FIG. 5, a W film 28 is formed by blanket CVD, filling the contact hole 22a and covering the TiN film 26. For example, the W film 28 is formed under the conditions of a $WF_6$ flow rate of 50 sccm, a pressure of 40 Torr and a temperature of 400° C.

Figure 6:
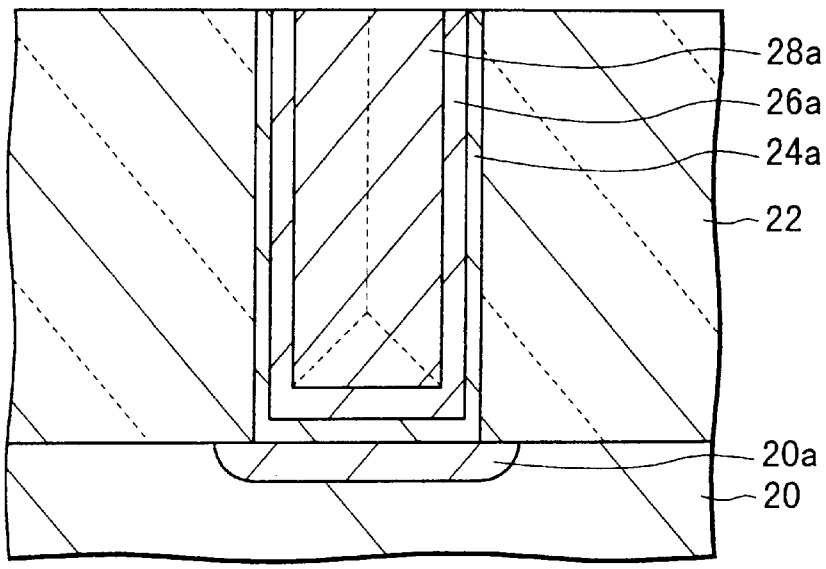
FIG. 6 is a cross sectional view of the substrate illustrating an etch-back process following the process illustrated in FIG. 5.

In a process illustrated in FIG. 6, a lamination of the W film 28, TiN film 26 and Ti film 24 is etched back until the upper surface of the insulating film 22 is exposed, leaving a W plug 28a (a portion of the W film 28), a portion 26a of the TiN film 26 and a portion 24a of the Ti film 24. As this planarizing process, a CMP (chemical mechanical polishing) process may be used in place of, or in combination with, the etch-back process. The TiN film 26 and Ti film 24 may be left to be used as part of a wiring layer to be formed later, without etching them back.

Figure 7:
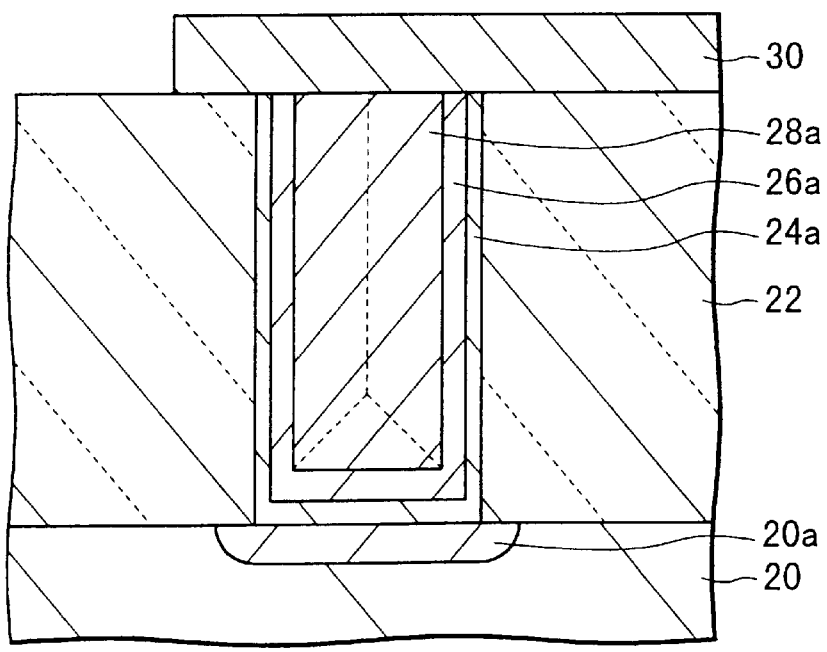
FIG. 7 is a cross sectional view of the substrate illustrating a wiring layer forming process following the process illustrated in FIG. 6.

In a process illustrated in FIG. 7, wiring material such as Al alloy is deposited on the upper surface of the substrate, and this deposited layer is patterned by photolithography and selective dry etching to form a wiring layer 30. The wiring layer 30 is therefore electrically connected to the impurity doped region 20a via the W plug 28a, TiN film 26a and Ti film 24a.

In the embodiment illustrated in FIGS. 4 to 7, the W film 28 is formed on the TiN film 26 having a high nitridation degree so that the W plug 28a having a high adhesion strength can be obtained, considerably lowering a possibility of adhesion defects.

Although description has been made on the case of connecting the Al alloy wiring pattern via the W plug to the Si surface, a W wiring pattern may be formed by using the W layer 28 as shown in FIG. 5, and patterning it together with the TiN layer 26 and the Ti layer 24. The above-described structures may also be used for a higher level wiring pattern of a multi-layer wiring structure.

The present invention has been described in connection with the preferred embodiments. The invention is not limited only to the above embodiments. For example, measuring a refractive index may be performed while the substrate is in a process chamber of a sputtering system, or an interference type film thickness meter or the like may be used. It is apparent that various modifications, improvements, combinations, and the like can be made by those skilled in the art.

What is claimed is:

1. A method of evaluating a titanium nitride film comprising the steps of:

forming said titanium nitride film over a substrate:

measuring an optical constant of the titanium nitride film; and judging a nitridation degree of the titanium nitride film in accordance with the measured optical constant.

2. A method according to claim 1, wherein said measuring step is performed with an ellipsometer.

3. A method according to claim 1, wherein said measuring step is performed using near infrared light.

4. A method according to claim 1, wherein said optical constant is a refractive index and said judging step includes a step of judging whether said refractive index is smaller than 2.

5. A method of forming a tungsten film comprising the steps of:

forming a titanium nitride film over a substrate;

measuring an optical constant of the titanium nitride film;

judging a nitridation degree of the titanium nitride film in accordance with the measured optical constant;

determining the conditions of forming the titanium nitride film in accordance with the results of said judgement step, the conditions satisfying that a nitridation degree of the titanium nitride film is acceptable;

forming another titanium nitride film covering another substrate, in accordance with the conditions determined by said conditions determining step; and forming said tungsten film on said another titanium nitride film.

6. A method according to claim 5, wherein said measuring step is performed with an ellipsometer.

7. A method according to claim 5, wherein said measuring step is performed using near infrared light.

8. A method according to claim 5, wherein said optical constant is a refractive index and said judging step includes a step of judging whether said refractive index is smaller than 2.

9. A method according to claim 5, wherein said another substrate is a silicon substrate, and the method further comprises:

prior to said step of forming said another titanium nitride film, forming an impurity doped region in said silicon substrate;

forming an insulating film on said silicon substrate; and forming a contact hole through the insulating film and exposing the impurity doped region.

10. A method according to claim 9, further comprising the step of removing the tungsten film on said another titanium nitride film to leave the tungsten film only in the contact hole.

11. A method of forming a tungsten film comprising the steps of:

forming a titanium nitride film over a substrate;

measuring an optical constant of the titanium nitride film;

judging from the measurement result of the optical constant whether a nitridation degree of the titanium nitride film is acceptable; and forming said tungsten film on the titanium nitride film if the judgement result by said judging step is affirmative.

12. A method according to claim 11, wherein said substrate is a silicon substrate, and the method further comprises:

prior to said step of forming the titanium nitride film, forming an impurity doped region in said silicon substrate;

forming an insulating film on said silicon substrate; and forming a contact hole through the insulating film and exposing the impurity doped region.

13. A method according to claim 11, further comprising the step of:

if the judgement result by said judging step is negative, annealing the titanium nitride film in a nitrogen atmosphere, said annealing step increasing the nitridation degree of the titanium nitride film to satisfy the predetermined criterion.

14. A method according to claim 13, further comprising the step of:

after said annealing step, forming a tungsten film on the titanium nitride film.

15. A method according to claim 13, further comprising the step of:

after said annealing process, measuring again the optical constant of the titanium nitride film.

16. A method of forming a tungsten film comprising the steps of:

forming a titanium nitride film over a substrate;

measuring an optical constant of the titanium nitride film;

judging from the measurement result of the optical constant whether a nitridation degree of the titanium nitride film is acceptable;

if the judgement result by said judging step is negative, annealing the titanium nitride film in a nitrogen atmosphere, said annealing step increasing the nitridation degree of the titanium nitride film so that the nitridation degree becomes acceptable; and after said annealing step, forming said tungsten film on the titanium nitride film.

17. A method according to claim 16, wherein said measuring step is performed with an ellipsometer.

18. A method according to claim 16, wherein said measuring step is performed using near infrared light.

19. A method according to claim 16, wherein said optical constant is a refractive index and said judging step includes a step of judging whether said refractive index is smaller than 2.

20. A method according to claim 16, wherein said substrate is a silicon substrate, and the method further comprises:

prior to said step of forming the titanium nitride film, forming an impurity doped region in said silicon substrate;

forming an insulating film on said silicon substrate; and forming a contact hole through the insulating film and exposing the impurity doped region.

21. A method of manufacturing a semiconductor device, comprising the steps of:

a) providing a substrate having an insulating film thereon;

b) forming a hole through the insulting film;

c) forming a titanium nitride layer over the substrate;

d) measuring an optical parameter of the titanium nitride layer without breaking thereof;

e) judging whether the titanium nitride layer is valid or not; and f) forming a tungsten layer over the valid titanium nitride layer.

22. A method according to claim 21, further comprising the step of:

g) etching back the tungsten layer so as to form a tungsten plug in the hole.

23. A method according to claim 21, further comprising the steps of:

b-1) after the step b), forming a titanium layer over the hole.

24. A method according to claim 21, wherein the optical parameter is a refractive index of the titanium nitride.

25. A method according to claim 24, wherein the step e) is judged based on whether the refractive index of the titanium nitride layer is two or less.

26. A method according to claim 21, further comprising the steps of:
- e-1) annealing the titanium nitride layer; and
- e-2) before the step f), judging whether the titanium nitride layer is valid or not.

27. A method of manufacturing a semiconductor device, comprising the steps of:
- a) providing a substrate having an insulating film thereon;
- b) forming a hole through the insulating film;
- c) forming a titanium nitride layer over the substrate;
- d) measuring a refractive index of the titanium nitride layer;
- e) judging whether the titanium nitride layer is valid or not by comparing the measured refractive index with a certain value; and
- f) forming a tungsten layer over the valid titanium nitride layer.

28. A method according to claim 27, further comprising the step of:
- h) etching back the tungsten layer so as to form a tungsten plug in the hole.

29. A method according to claim 27, further comprising the steps of:
- b-1) after the step b), forming a titanium layer over the hole.

30. A method according to claim 27, wherein the step e) is judged based on whether the refractive index of the titanium nitride layer is two or less.

31. A method according to claim 27, further comprising the steps of:
- e-1) annealing the titanium nitride layer; and
- e-2) before the step f), judging whether the titanium nitride layer is valid or not.

* * * * *